(12) United States Patent
Oshino (10) Patent No.: US 6,356,616 B1
(45) Date of Patent: Mar. 12, 2002

(54) APPARATUS AND METHODS FOR DETECTING POSITION OF AN OBJECT ALONG AN AXIS

(75) Inventor: Tetsuya Oshino, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/634,235

(22) Filed: Aug. 8, 2000

(30) Foreign Application Priority Data

Aug. 11, 1999 (JP) .......................................... 11-227003

(51) Int. Cl.⁷ .............................................. G03F 7/207
(52) U.S. Cl. ......................................... 378/34; 378/206
(58) Field of Search ................................ 356/614, 615, 356/399, 400; 378/34, 205, 206

(56) References Cited

U.S. PATENT DOCUMENTS

| | | | | |
|---|---|---|---|---|
| 4,852,133 A | * | 7/1989 | Ikeda et al. | 378/34 |
| 5,600,698 A | * | 2/1997 | Tershima et al. | 378/34 |
| 6,240,158 B1 | * | 5/2001 | Oshino | 378/34 |

* cited by examiner

*Primary Examiner*—David P. Porta
(74) *Attorney, Agent, or Firm*—Klarquist Sparkman, LLP (57) ABSTRACT

The present invention relates to projection-exposure apparatus for projecting an accurate pattern defined by a reticle onto a substrate and, more particularly, to exposure apparatus used to transfer a circuit pattern on a mask or reticle through a reflection-type imaging apparatus onto a substrate such as a wafer by the mirror-projection method, for example using an X-ray optical system. The exposure apparatus includes an axial-position (e.g., focal point) detection system. Most or all of the components of the axial-position detection system are enclosed in a vacuum chamber along with the projection-optical system of the exposure apparatus. The axial-position detection system of the exposure apparatus of the present invention accurately measures, for example, the axial height of the surface of a substrate. The substrate surface position may then be adjusted to position the surface in the range of the focal depth of the X-ray projection-optical system. Using the exposure apparatus of the present invention, a resist pattern having the desired resolution is formed on the substrate surface while maintaining a relatively high throughput in the fabrication of integrated circuits.

20 Claims, 6 Drawing Sheets

Prior Art

APPARATUS AND METHODS FOR DETECTING POSITION OF AN OBJECT ALONG AN AXIS

TECHNICAL FIELD OF THE INVENTION

The invention pertains to methods and apparatus for transferring, by projection, a pattern defined by a reticle or mask onto a sensitized substrate using a mirror-projection system, such as an X-ray optical system.

BACKGROUND OF THE INVENTION

A projection-exposure apparatus for fabrication of integrated circuits projects and transfers a circuit pattern defined by a reticle or mask (these terms are used interchangeably herein) onto a sensitized substrate (e.g., a semiconductor wafer) through an image forming-apparatus. Such exposure apparatus conventionally use an illumination source (light source), such as an i-line light source. Upon illumination of the reticle with the light source, the illuminated pattern defined by the reticle is projected and inscribed on the substrate. The pattern defined by the reticle is typically either larger than or equal in size to the pattern to be inscribed on the substrate.

Conventional exposure apparatus typically include an illumination-optical system and a projection-optical system. A substrate stage adjusts the substrate's axial position (height) and inclination. The substrate stage also adjusts the substrate's position on the XY plane. When projection-exposing a reticle pattern onto a substrate, the patterned surface of the reticle is first aligned with the substrate surface; that is, the focal points are aligned. For projection exposure using light (e.g., UV light), the projection-optical system ordinarily comprises a plurality of lenses and is arranged so that the pattern formed on the reticle can be focused on the surface of the substrate and transferred in a single shot. Since most projection-optical systems have a field of view of approximately 20 mm², a desired region (e.g., typically a region equivalent to two semiconductor chips) can be exposed at one time.

In recent years, as progress has been made in terms of higher performance and a higher degree of integration in semiconductor integrated circuits, there has been continual demand for increased accuracy and resolution in pattern transfer. Accordingly, errors with respect to imageformation characteristics that accompany inaccurate measurement of the substrate surface height (often caused by insufficient flatness of the substrate surface and/or substrate stage) cannot be ignored.

A focal-point (axial-position) detection system is typically used to determine the substrate surface height in order to achieve alignment of the focal point across a wide exposure field. A slit image is first projected obliquely relative to the optical axis AX (i.e., the slit image is not projected through the projection-optical system) onto each of multiple measurement points located inside the shot region (exposure field) of a substrate. The axial-position detection system (based on the oblique-incidence method) is used to receive light from the reflected image by a two-dimensional array sensor.

Generally, the resolution W of an exposure apparatus is determined by the exposure wavelength λ and the numerical aperture NA of the projection-optical system. The resolution W is calculated as follows:

$$W = k_1 \lambda / NA$$

wherein $k_1$ is a constant. In order to increase the resolution, it is necessary to shorten the wavelength of the illumination source or to increase the numerical aperture. For example, when an i-line light source having a wavelength of 365 nm is used for illumination, a resolution of 0.5 μm is obtained at a numerical aperture of approximately 0.5. It is difficult, however, to increase the numerical aperture in such a system. Accordingly, it has been necessary to further shorten the wavelength of the illumination source.

Excimer lasers have begun to be used as sources for illumination as excimer lasers produce light with wavelengths that are shorter than i-line (e.g., 248 nm for KrF and 193 nm for ArF excimer lasers). A resolution of 0.25 μm may be obtained when using a KrF illumination source, and a resolution of 0.18 μm may be obtained when using an ArF exposure-illumination source. If X-rays (having a wavelength of about 13 nm) are used as the illumination source, a resolution of 0.1 μm or better may be obtained.

When such exposure apparatus use X-rays as the illumination source, the projection-optical system must be constructed entirely from reflective mirrors. Unfortunately, it is difficult to design such a projectionoptical system having a broad exposure field. In addition, when attempting to design such a projection-optical system having a higher resolution, the exposure field is even further reduced. A smaller exposure field has the necessary result that the desired pattern region cannot be exposed in a single shot. Accordingly, integrated circuit throughput is decreased and manufacturing costs are increased.

If the exposure field of the projection-optical system is formed in the shape of an annular band, a higher resolution may be obtained in a long, narrow exposure field. Semiconductor chips that are 20 mm² or larger may be exposed, even with a projection-optical system having a small exposure field, by scanning the reticle and substrate during the exposure process.

Figure 6:
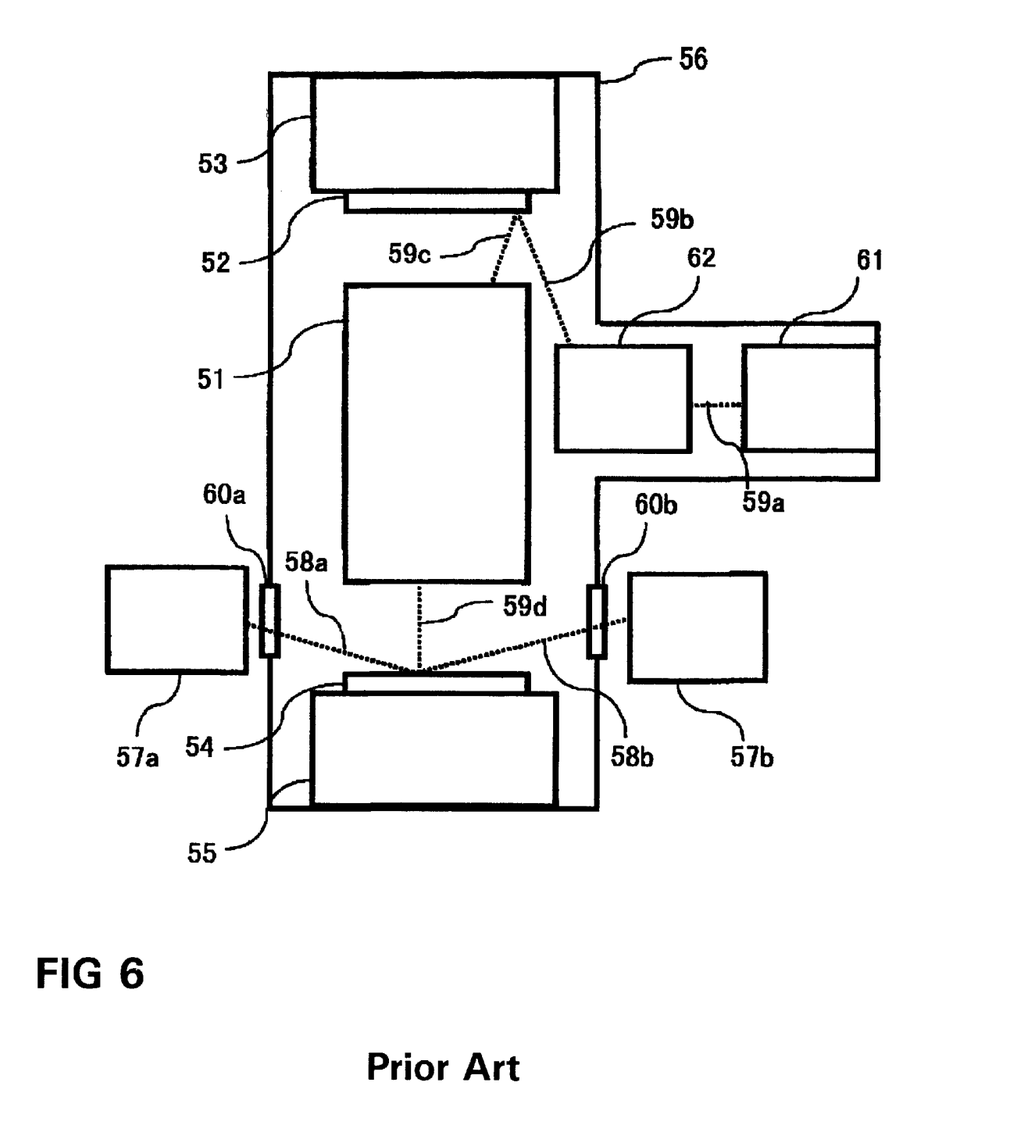
FIG. 6 is a schematic drawing of a conventional X-ray projection-exposure apparatus.

A conventional X-ray-projection-exposure apparatus is illustrated in FIG. 6. The X-ray-projection-exposure apparatus shown in FIG. 6 includes an X-ray source 61, an illumination-optical system 62, a projection-optical system 51, a reticle stage 53 that secures a reticle 52, and a substrate stage 55 to which a substrate 54 is mounted. A vacuum chamber 56 encloses the X-ray source 61, illumination-optical system 62, projection-optical system 51, reticle 52, reticle stage 53, substrate 54, and substrate stage 55. The exposure apparatus further includes a axial-position detection system 57a, 57b. The axial-position detection system 57a, 57b is positioned outside the vacuum chamber 56.

The illumination-optical system directs X-rays to irradiate a portion of the pattern defined by the reticle. The projection-optical system 51, typically comprising a plurality of mirrors, is arranged so that the pattern on the reticle 52 is reduced, projected, and focused onto the surface of the substrate 54. Multi-layer films are formed on the surfaces of the projection-optical system 51 reflective mirrors to heighten the X-ray reflectivity. The projection-optical system 51 has an annular-band shaped exposure field. The projection-optical system 51 projects a portion of the reticle pattern in an annular-band shape onto the surface of the substrate 54. During exposure, the reticle 52 and substrate 54 are synchronously scanned at a constant speed, so that the desired pattern region on the reticle (e.g., a region corresponding to a single semiconductor chip) can be projected onto the substrate 54.

Soft X-rays having a wavelength of approximately 13 nm, for which a high reflectivity is obtained from the multi-layer films of the projection-optical system 51, may be used as the illumination source. However, such soft X-rays are extensively absorbed by air. Accordingly, at least the reticle 52, substrate 54 and projection-optical system 51 must be disposed inside the vacuum chamber 56 so that the light path of the X-rays is maintained in a vacuum. The interior of the vacuum chamber 56 is evacuated by means of a vacuum pump (not shown).

In such an X-ray-projection-exposure apparatus, since the substrate 54 must be disposed in the vacuum chamber, at least a portion of the light beam of the axial-position detection system 57a, 57b passes through the vacuum. However, a conventional axial-position detection system cannot be disposed in a vacuum. If the entire axial-position detection system is disposed in a vacuum, radiation of heat generated by the axial-position detection system light source (e.g., a halogen lamp) becomes a problem. Conventionally, when such a light source is operated in an air atmosphere, heat generated by the lamp is dissipated into the surrounding atmosphere. However, if such a light source is operated within a vacuum, the significant amount of heat generated by the light source cannot be dissipated. As a result, the heat melts the light source. Accordingly, conventional X-ray-projection-exposure apparatus include a axial-position detection system wherein both the irradiating device 57a and the detection device 57b are disposed outside the vacuum chamber 56.

As shown in FIG. 6, first and second windows 60a and 60b (through which the axial-position detection light beam passes) are formed in the vacuum chamber 56. The first window 60a is disposed between the irradiating device 57a and the substrate 54. The second window 60b is disposed between the detection device 57b and the substrate 54. A light beam 58a passes through the first window 60a and strikes the substrate 54. The light beam 58b reflected from the surface of the substrate then passes through the second window 60b and is conducted to the detection device 57b.

When the axial-position detection system is constructed as described above, however, even though the height of the substrate 54 can be measured, the focal-point-detection device cannot be disposed in the X-ray-projection-optical system 51. As a result, the relative distance between the projection-optical system 51 and the substrate 54 cannot be accurately determined. Accordingly, there is a drop in reproducibility of the axial-position detection measurement leading to lower precision integrated circuit formation.

Accordingly, there is a need for an X-ray projection-exposure apparatus that is capable of performing high-accuracy detection of axial position without causing untimely deterioration of the axial-position detection optical components.

SUMMARY OF THE INVENTION

In view of the shortcomings of the prior art, the present invention provides, inter alia, X-ray-projection-exposure apparatus comprising an X-ray source and an X-ray illumination-optical system for directing X-ray light to irradiate a pattern defined by a reticle. The exposure apparatus further includes a projection-optical system for directing illumination light along a Z axis from the reticle pattern to project an image of the reticle pattern on a sensitive surface of a substrate (the Z axis being an optical axis of the projection-optical system). A substrate stage is operable to hold the substrate for exposure of the sensitive surface and to move the substrate in the X, Y, and Z directions.

The exposure apparatus further includes a reticle stage that secures the reticle such that the pattern on the reticle may be irradiated by the illumination-optical system. A vacuum chamber encloses the projection-optical system, the reticle stage and reticle, and the substrate stage and the substrate. The vacuum chamber further encloses an axial-position detection system (e.g., focal-point detection system). The axial-position detection system operates to optically detect the position of the substrate surface (thus, the focal point) in the direction of the optical axis of the projection-optical system.

The axial-position detection system of the exposure apparatus of the present invention preferably comprise a first irradiating assembly and a second irradiating assembly. The first irradiating assembly includes a light source positioned and configured to illuminate a first slit. The first irradiating assembly also includes at least part of a light-transmitting system situated and configured to conduct light from the light source to the first slit. The second irradiating assembly also includes at least part of the light-transmitting system (not included in the first irradiating assembly) for illuminating the first slit, a first optical assembly for projecting light passing through the first slit to form an image of the first slit on the substrate surface, and a second slit. The axial-point detection system further includes a light-receiving assembly including a second optical assembly for projecting an image of the first slit formed on and reflected from the surface of the substrate onto a second slit. The light-receiving assembly further includes a detector that receives and measures the intensity of light that passes through the second slit. In one embodiment, the vacuum chamber also encloses the first slit, the first and second optical assemblies, and the second slit.

In the X-ray projection-exposure apparatus of the present invention, the principal components of the axial-position detection system may be secured to a projection-optical box (POB) of the projection-optical system. As a result, the substrate height is measured with high accuracy, and the substrate-surface position may be adjusted to a position in the range of the focal depth of the X-ray projection-optical system. Accordingly, a resist pattern having the desired pattern resolution is formed on the substrate surface while maintaining a relatively high throughput in the fabrication of integrated circuits.

DETAILED DESCRIPTION OF THE INVENTION

Figure 1:
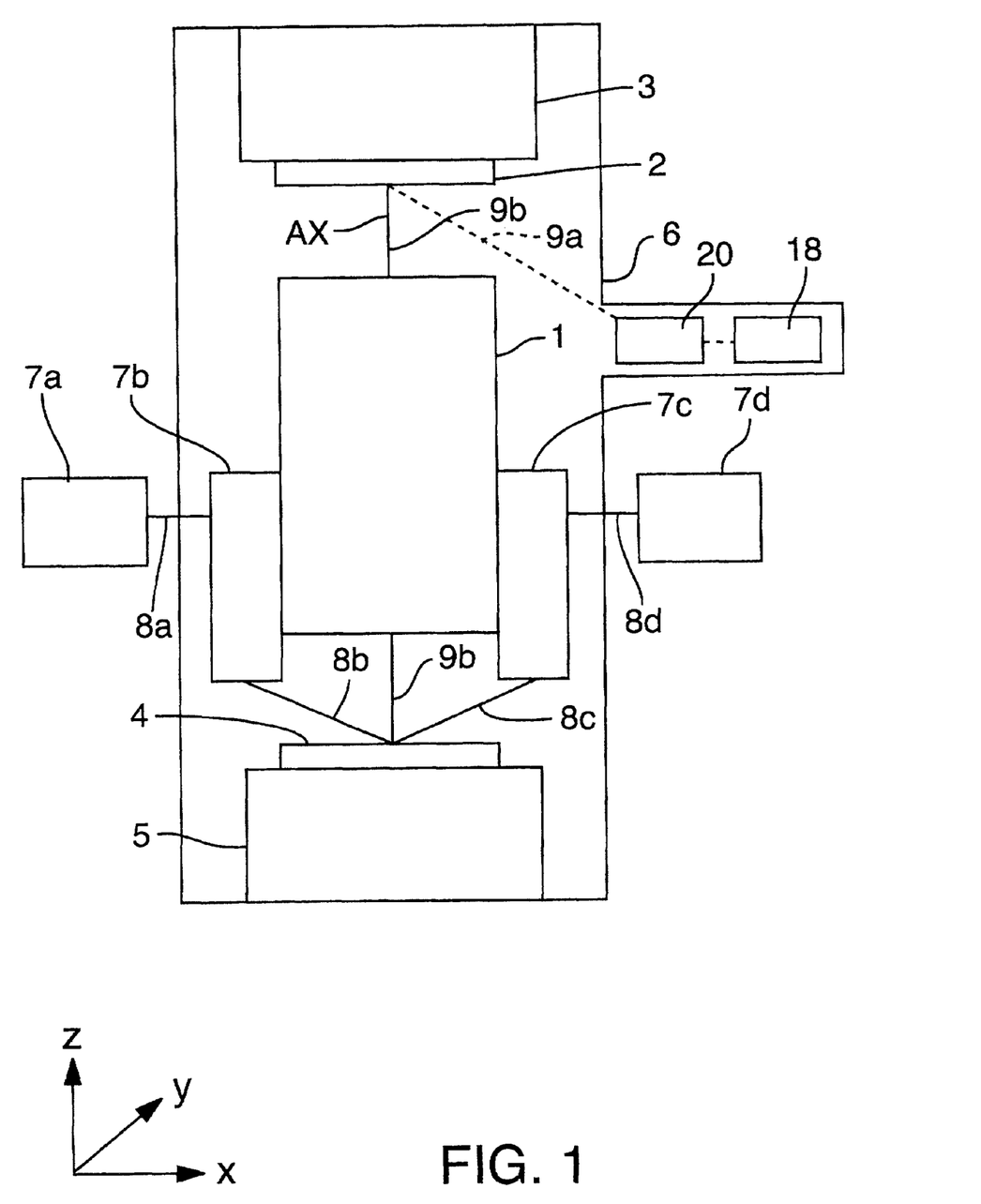
FIG. 1 is a schematic drawing of an embodiment of the X-ray projection-exposure apparatus of the present invention.

FIG. 1 illustrates the overall structure of a first preferred embodiment of the projection-exposure apparatus of the present invention. In FIG. 1, the Z axis is parallel to the optical axis AX of a projection-optical system 1. The X axis and the Y axis are orthogonal to the Z axis. The projection-optical system 1 preferably comprises four reflective mirrors (not shown) and has a projection magnification of ¼. The respective shapes of the reflective surfaces of the reflective mirrors are preferably non-spherical. The surfaces of the reflective mirrors are preferably coated with a multilayer film comprising any suitable coating material to increase the X-ray reflectivity of the mirrors. For example, the surfaces of the mirrors may be coated with a Mo/Si multi-layer film to increase the X-ray reflectivity. The projection-optical system 1 preferably includes annular-band-form exposure field having, for example, a width of about 2 mm and a length of about 30 mm.

A light source 18 for emitting a light beam, e.g., X-rays, is positioned adjacent an illumination-optical system 20. The illumination-optical system 20 directs the light beam to irradiate a pattern defined by a reticle 2 (preferably a reflective-type reticle). The pattern defined by the reticle is preferably equal in size to or larger than the pattern image that is to be inscribed on the substrate 4.

The light source 18 preferably comprises a laser-plasma X-ray source that produces X-ray light having a wavelength of about 13 nm. When such a light source 18 is used, an X-ray light beam 9a is irradiated through the illumination-optical system 20 and is directed by the illumination-optical system 20 to the surface of the reticle 2. The X-ray beam 9b reflected by the reticle 2 is projected by the projection-optical system 1 so that the exposed portion of the pattern on the reticle 2 is reduced and projected onto the substrate 4.

The reticle 2 is secured to a reticle stage 3 positioned upstream of the projection-optical system 1. The exposure apparatus further includes a substrate stage 5 upon which a substrate 4 is carried. During exposure, the reticle 2 and substrate 4 are scanned synchronously by means of the respective reticle and substrate stages 3 and 5. The scanning speed of the substrate 4 is synchronized at one quarter of the scanning speed of the reticle 2. As a result, the size of the pattern on the reticle 2 can be reduced to ¼ and projected onto the surface of the substrate 4.

A vacuum chamber 6 encloses the projection-optical system 1, the reticle stage 3 and reticle 2, and the substrate stage 5 and the substrate 4. The vacuum chamber 6 further encloses at least a portion of a axial-position detection system 7a–7d of the exposure apparatus.

The oblique-incidence-type axial-position detection system 7a–7d (referred to as the "axial-position detector 7a–7d") flanks the projection-optical system 1. The axial-position detector 7a–7d precisely measures the Z direction positions or heights (e.g., focal-point positions) of each of multiple measurement points on the surface of the substrate 4.

The axial-position detector 7a–7d preferably includes a light-irradiating assembly 7a, 7b and a light-receiving assembly 7c, 7d. The light-irradiating assembly 7a, 7b operates to emit a light beam 8a, and project a light beam image 8b onto the surface of the substrate 4. The light-receiving assembly 7c, 7d detects light beam image 8c reflected from the surface of the substrate 4. Illuminating light beam image 8b emitted from the light-irradiating assembly 7a, 7b is directed onto the surface of the substrate 4 at an inclined angle. The position of the surface of the substrate 4 is detected by measuring the intensity of the reflected light-beam image 8c with detectors in the light-receiving assembly 7c, 7d.

The light-irradiating assembly 7a, 7b preferably includes a first irradiating assembly 7a disposed outside the vacuum chamber 6 and a second irradiating assembly 7b disposed within the vacuum chamber 6. The light-receiving assembly 7c, 7d preferably includes a first light-receiving assembly 7c disposed within the vacuum chamber 6 and a second light-receiving assembly 7d disposed either inside or outside the vacuum chamber 6.

Figure 2:
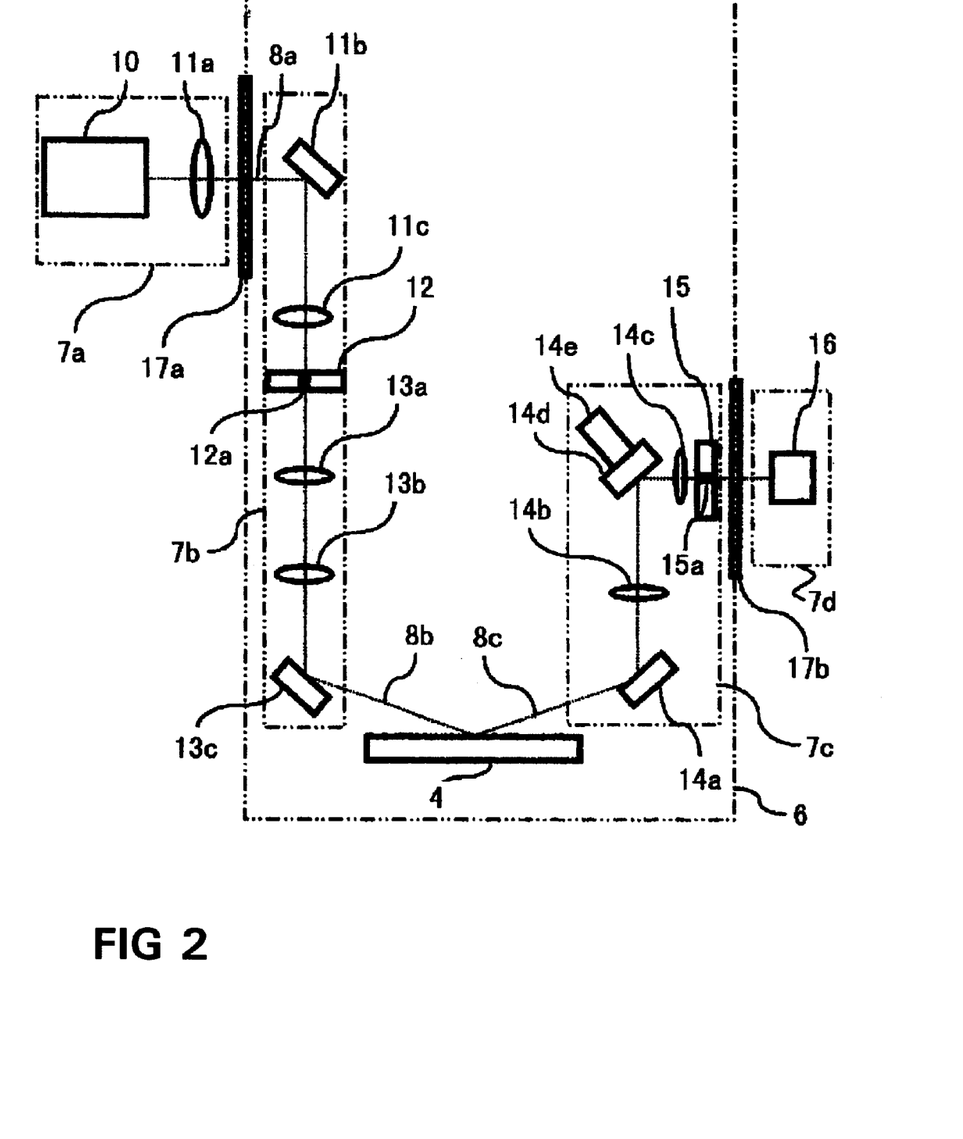
FIG. 2 is a schematic drawing of an embodiment of the axial-position detection system of the present invention.

FIG. 2 illustrates the axial-position detector 7a–7d of the exposure apparatus shown in FIG. 1, in greater detail. With reference to FIG. 2, the first irradiating assembly 7a includes a light source 10 and an optical element 11a. Light source 10 preferably comprises white light, including visible light or infrared radiation. When a white light source is used, the effects of interference caused by light reflected from the surface of the substrate 4 and the surface of resist on the surface of the substrate 4 can be reduced and higher accuracy in position detection can be achieved. For example, light source 10 may comprise a halogen lamp. The wavelength range emitted from such a light source 10 may be limited by use of a suitable filter positioned within a light-transmitting system.

The light from light source 10 is directed onto a first slit 12 by means of the light-transmitting system. The light-transmitting system preferably comprises optical elements 11a–11c positioned upstream of the first slit 12. Optical elements 11a–11c preferably form a Köhler illumination system. The first slit 12 preferably comprises a chromium film formed as a pattern on a glass substrate, wherein the chromium film defines a single rectangular opening 12a (about 4 mm×0.2 mm). A first optical assembly preferably comprises optical elements 13a–13c. The first optical assembly has a magnification of ¼. Accordingly, when the first slit 12 is irradiated, a reduced image of the opening 12a is formed on the surface of the substrate 4.

The light-receiving assembly preferably comprises optical elements 14a–14d and driving mechanism 14e, all positioned upstream of a second slit 15. The components 14a–14e constitute a "second optical assembly." Driving mechanism 14e may comprise, for example, a piezo-electric element. The second optical assembly has a magnification of 2 so that an enlarged image of the first slit image formed on the surface of the substrate 4 is formed on the second slit 15.

The second slit 15 preferably comprises a chromium film formed as a pattern on a glass substrate (as discussed above in relation to the first slit 12). A single rectangular opening 15a (about 4 mm×0.2 mm) is preferably formed in the second slit 15. The angle of the optical element 14d may be vibrated by the driving mechanism 14e at an amplitude of about 0.1 mrad and a frequency of about 1 KHz. Optical element 14d comprises a mirror that is preferably located near the pupil of the light-receiving assembly. With such an arrangement, it is possible to reduce detection error caused by positional error of the vibrating mirror. The light-receiving assembly 7c, 7d further includes a detector 16 that measures the intensity of the light passing through the second slit 15. The detector 16 preferably comprises a photodiode.

When the second optical assembly of the axial-position detector 7a–7d comprises mirrors and a driving mechanism that periodically varies the angles of the mirrors, high-speed, high-accuracy detection of the axial position can be accomplished. Specifically, the mirrors are vibrated so that the position of the projected image of the first slit 12 on the second slit 15 periodically varies. As a result, a detection signal with a periodically varying amplitude is obtained and the substrate 4 position is detected with high accuracy by subjecting the signal to electrical processing.

The driving mechanism 14e comprises any suitable mechanism operable in a vacuum. Since, however, the temperature of the driving mechanism 14e tends to rise in a vacuum, it is desirable to use a driving mechanism that generates a relatively low level of heat. For example, a piezo-electric element may be used as piezo-electric elements typically have a small driving stroke. However, since the axial-position detector 7a–7d can be configured such that the vibrational amplitude of the vibrating mirrors is small, other driving mechanisms are suitable for use.

The first embodiment further includes a first window 17a positioned between the first irradiating assembly 7a and the second irradiating assembly 7b. Light beam 8a passes through window 17a to the second irradiating assembly 7b. Window 17a is preferably positioned inside the vacuum chamber 6. The window 17a preferably comprises a material that possesses a high transmissivity to light, such as glass, and preferably includes an anti-reflection film on its surface. To suppress possible effects of refraction caused by the first window 17a, it is preferable to collimate the light beam passing through the window 17a into a parallel light beam. A second window 17b is positioned between the first light-receiving assembly 7c and the second light receiving assembly 7d. Light beam 8d passes from the first light-receiving assembly 7c through window 17b and to the second light-receiving assembly 7d.

In the first embodiment of the exposure apparatus of the present invention, as shown in FIGS. 1 and 2, optical elements 11b and 11c of the light-transmitting system, the first slit 12, the first optical assembly (13a–13c), the second optical assembly (14a–14e), and the second slit 15, are all disposed within the vacuum chamber 6. Each of the aforementioned components of the axial-position detector 7a–7d are preferably secured to a projection-optical box ("POB," not shown) of the projection-optical system 1. The first slit 12, second slit 15, and driving mechanism 14e are preferably secured by holding members made of a low-thermal-expansion metal, e. g., INVAR™. A low-thermal-expansion glass (e.g., having a thermal expansion coefficient of $3 \times 10^{-8}$ $K^{-1}$) is preferably used to form the mirror substrates of the optical elements 13c, 14a, and 14d.

Using the first embodiment of the exposure apparatus, the height of a substrate (thus, the focal-point position) is detectable with an accuracy of 0.1 μm or better. Additionally, a resist pattern having a resolution of 0.1 μm over a region equivalent to one semiconductor chip on the surface of the substrate 4, is obtainable. Such accuracy and resolution are obtained, at least in part, due to performing the substrate exposure with the substrate position aligned with the focal point position of the X-ray projection-optical system 1.

Because the light source 10 of the axial-position detector 7a–7d is positioned outside of the vacuum chamber 6, heat generated by the light source is easily dissipated and the light source does not suffer heat damage. Furthermore, because the light source 10 is positioned separately from the projection-optical system 1, the second irradiating assembly 7b, and the first light-receiving assembly 7c, deterioration of the performance of the optical elements typically caused by heat generated by the light source 10 is also avoided.

When the first slit 12 is irradiated with light beam 8a, the first optical assembly projects an image of the first slit 12 onto the surface of the substrate 4. Light reflected from the surface of the substrate 4 then enters the second optical assembly so that a re-projected image of the image of the first slit formed on the substrate 4 is formed on the second slit 15. First and second slits 12, 15 may each include a single corresponding opening (e.g., 12a, 15a, respectively) or may include multiple corresponding openings (also discussed below in reference to the second embodiment). If the first and second slits 12, 15 include a plurality of corresponding openings, the light-receiving assembly 7c, 7d of the axial-position detector preferably includes a plurality of detectors, such as a plurality of CCDs or the like, to simultaneously receive and detect light passing through the plurality of openings in the second slit 15.

When the first and second slits 12, 15 each include only a single opening, the axial position ("height") of a single point on the substrate 4 may be determined. When multiple respective openings are formed in the first and second slits, however, the respective heights of the substrate surface at multiple locations may be determined. Accordingly, the axial position to be determined at a plurality of points within the exposure field. If the height of the substrate 4 varies, the position of the image of the first slit 12 formed on the second slit 15 also varies. Changes in the position of the height of the substrate surface relative to the projection-optical system 1 are ascertained. For example, if the opening(s) in the second slit and the projected image of the first slit formed on the second slit are roughly equal in size, then a change in the position of the image is readily detected by measuring changes in the intensity of the light passing through the second slit.

The X-ray projection-exposure apparatus of the present invention preferably exposes a region having a length of about 20 mm or greater. Accordingly, it is desirable that the axial-position detector 7a–7d be operable to detect the position of the surface of the substrate 4 throughout such an exposure region. Further, when a plurality of focal points within the exposure region on the substrate 4 are measured simultaneously, the time needed to determine the heights of the substrate surface (i.e., focal point positions) is shortened and, thus, processing throughput is increased.

Because the axial-position detector of the present invention is a precision measuring device, it is desirable to minimize deterioration in optical performance typically caused by temperature variations. In some cases, however, the temperature of the axial-point detector may rise as a result of heat generated by the absorption of white light by the optical elements or by heat generated by the driving mechanisms of the optical elements. Further, because it is difficult to dissipate heat generated by components disposed within the vacuum chamber 6, a temperature-regulating mechanism is preferably included in at least one of the following components: the first slit 12, the first optical assembly, the second slit 15, the second optical assembly, or the light-transmitting system. The temperature-regulating mechanism may comprise, for example, a cooling mechanism utilizing a cooling medium such as water, mechanisms that allow heat to escape by causing a material with a large thermal conductivity to contact the constituent members of the axial-position detector, an electronic cooling mechanism such as a Peltier element, or the like.

The axial-position detector 7a–7d may also be constructed of a material that is not substantially affected by temperature changes. For example, a low-thermal-expansion glass with a thermal expansion coefficient of $10^{-6}$ $K^{-1}$ or less may be used as materials for forming the mirrors. Further, the holding members of the optical elements may be constructed from, for example, a low-thermal-expansion metal having a thermal expansion coefficient of $2 \times 10^{-6}$ $K^{-1}$ or less. Thus, variations in the positional relationships of the optical elements caused by temperature changes may be minimized.

Figure 3:
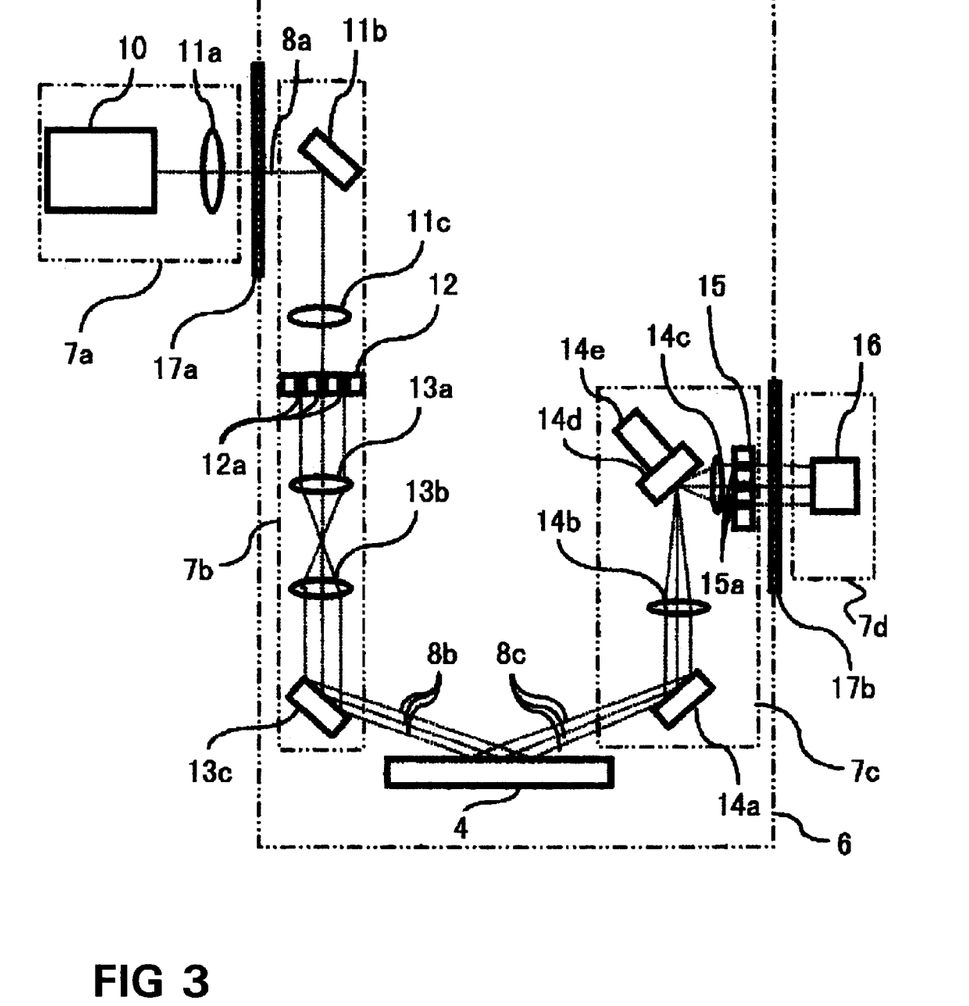
FIG. 3 is a schematic drawing of another embodiment of the axial-position detection system of the present invention.

A second embodiment of the projection-exposure apparatus of the present invention is illustrated in FIG. 3. The second embodiment is substantially the same as the first embodiment, except that three rectangular openings 12a are formed in the first slit 12 and three corresponding rectangular openings 15a are formed in the second slit 15.

The detector 16 preferably comprises three photodiodes. Further, in the second represented embodiment, the first slit 12, the first optical assembly, the second optical assembly, and the second slit 15 are preferably maintained at a constant temperature by means of a temperature regulating mechanism using a cooling medium.

When axial-position detection is performed using the apparatus of the second embodiment, the substrate height may be measured in the central portion and peripheral portions of the annular-band exposure field with an accurancy of at least 0.1 µm and a resist pattern having a resolution of at least 0.1 µm. Such accuracy and resolution are obtained over a region equivalent to one semiconductor chip on the substrate.

Figure 4:
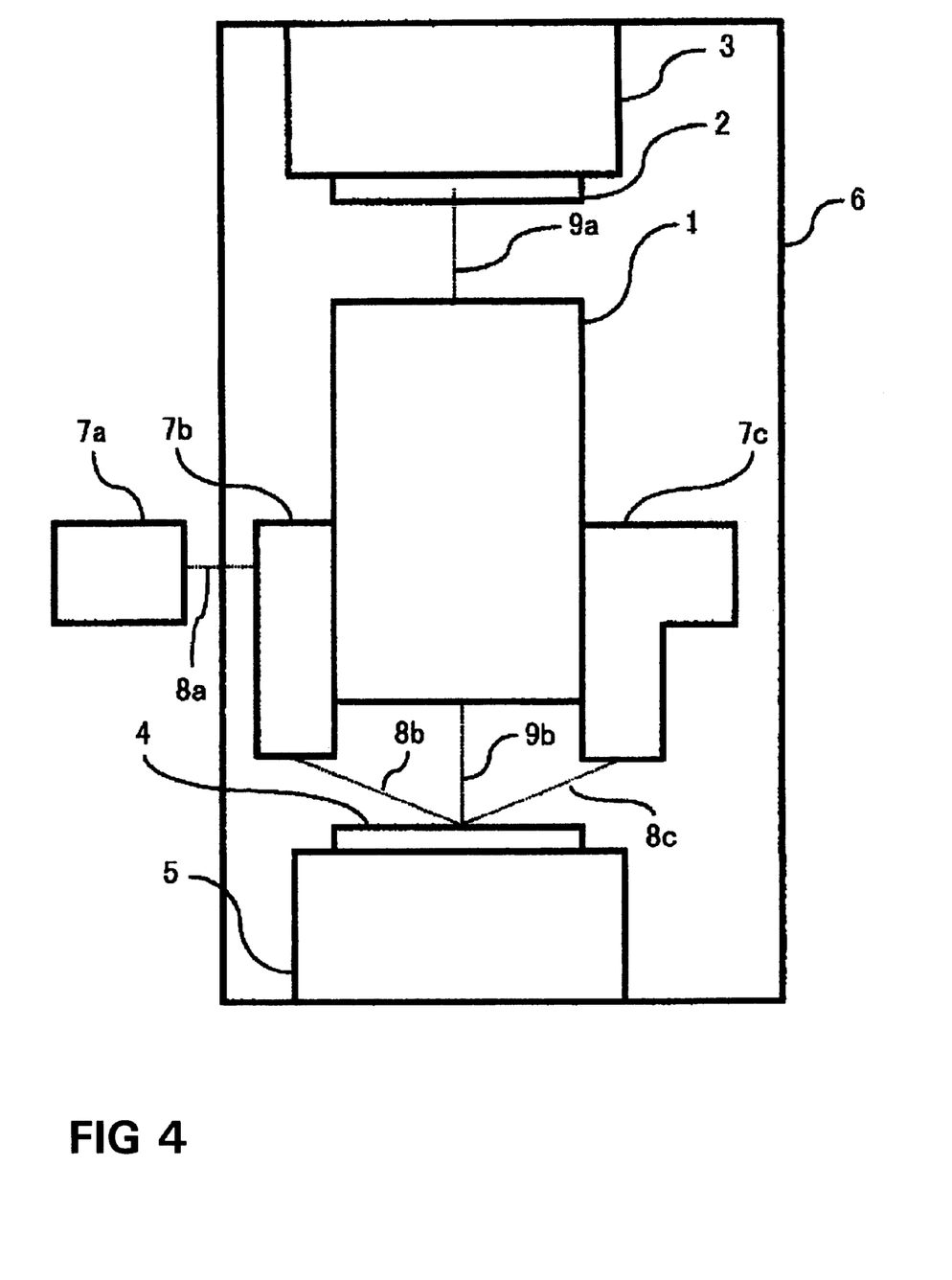
FIG. 4 is a schematic drawing of another embodiment of the X-ray projection-exposure apparatus of the present invention.
Figure 5:
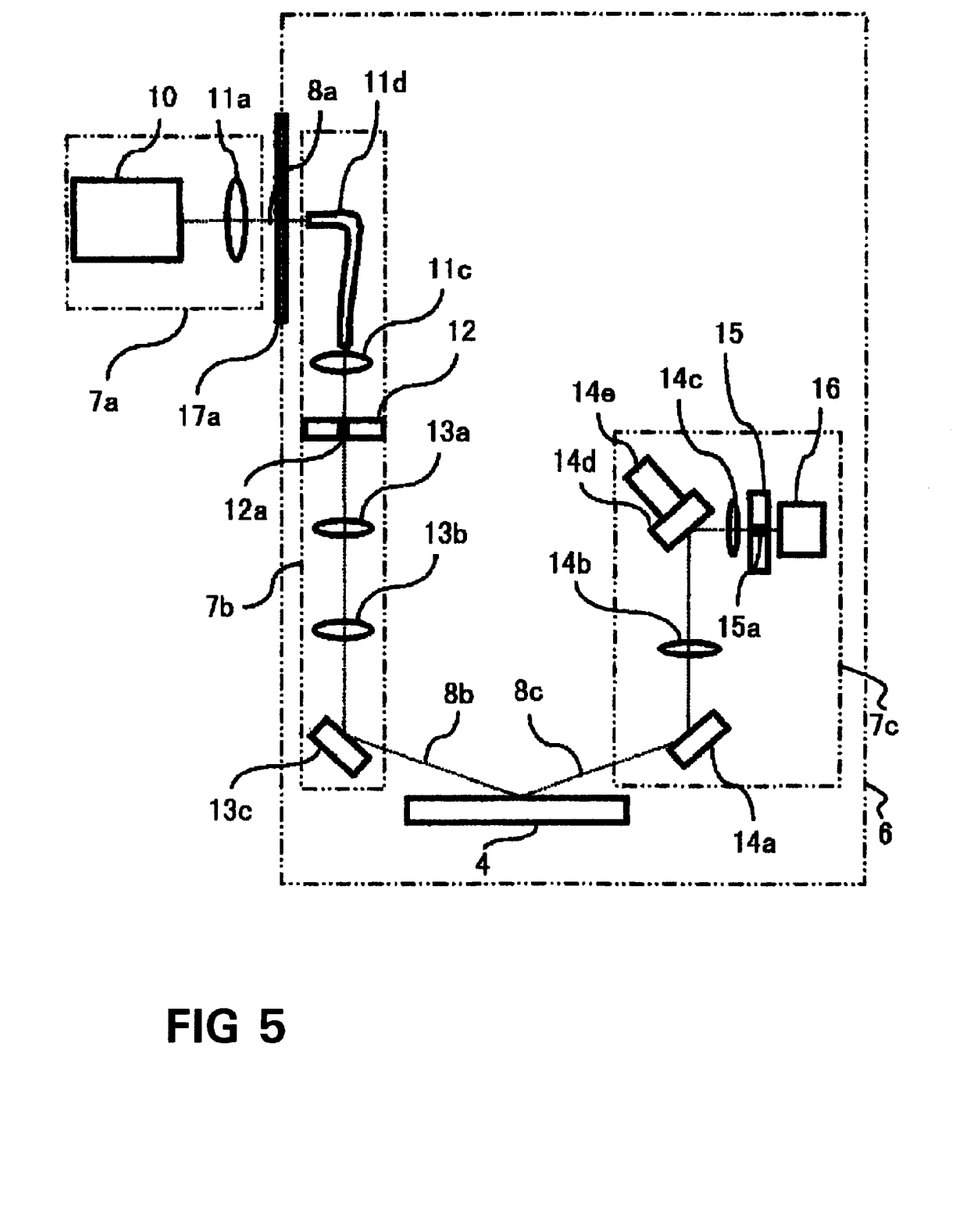
FIG. 5 is a schematic drawing of another embodiment of the axial-position detection system, as used, for example, in the X-ray projection-exposure apparatus shown in FIG. 4.

A third embodiment of the projection-exposure apparatus is illustrated in FIGS. 4 and 5. The third embodiment of the apparatus is similar to the first embodiment described above (FIGS. 1 and 2) with the exception of the axial-position detector 7a–7c. With reference to FIG. 5, the axial-position detector 7a–7c of the third embodiment includes a light source 10, such as a halogen lamp. Visible white light emitted from the light source 10 is directed onto a first slit 12 by means of alight-transmitting system. The light-transmitting system comprises, in part, optical elements 11a and 11c and an optical fiber 11d to form a Köhler illumination system. The first slit 12 preferably comprises a chromium film on a glass substrate defining a single rectangular opening 12a (about 500×200 µm). A first optical assembly (comprising optical elements 13a–13c) desirably has a magnification of ¼ to project a reduced image of opening 12a on the surface of the substrate 4. A second optical assembly (comprising optical elements 14a–14d, and a driving mechanism 14e), has a magnification of 2. Accordingly, the second optical assembly projects an enlarged image of the first slit image formed on the surface of the substrate 4 on the second slit 15, which is then detected by detector 16. Detector 16 preferably comprises a photodiode.

The second slit 15 preferably comprises a chromium film formed as a pattern on a glass substrate in the same manner as set forth above in relation to first slit 12. A single rectangular opening 15a (about 4 mm×0.2 mm) is formed in the second slit 15. The mirror 14d of the second optical assembly is vibrated by the driving mechanism 14e. The mirror 14d is preferably located near the pupil of the second optical assembly for the reasons discussed above in relation to the first embodiment. Driving mechanism 14e preferably comprises a piezo-electric element and vibrates the mirror 14d at an amplitude of about 0.1 mrad and a frequency of about 1 KHz.

In the third embodiment of the present invention exposure apparatus, the vacuum chamber 6 encloses the light-transmitting system (including optical element 11c, optical fiber 11d, and optical elements 13a–13c). The vacuum chamber 6 also encloses the first slit 12, the second optical assembly, the second slit 15, and the detector 16. The components enclosed in the vacuum chamber 6 are preferably secured to a projection-optical box (POB) of the X-ray projection-optical system 1 (FIG. 4) by securing means made of, e.g., INVAR™ material. A low-thermal-expansion glass (thermal expansion coefficient: 3×10$^{-8}$ K$^{-1}$) is preferably used for the substrates of mirrors 13c, 14a, and 14d.

The first slit 12, optical elements 13a–13c, optical elements 14a–14e, and second slit 15 are preferably maintained at a constant temperature by means of a temperature-regulating mechanism utilizing a cooling medium.

Using the apparatus of the third embodiment the substrate "height" (position along an optical axis) is measurable to an accuracy of at least 0.1 µm and a resist pattern with a resolution of at least 0.1 µm is obtainable. Such accuracy and resolution is obtainable over a region equivalent to one semiconductor chip.

Having illustrated and described the principles of the invention with specific embodiments, it should be apparent to those skilled in the art that the invention can be modified in arrangement and detail without departing from such principles. I claim all the modifications coming within the spirit and scope of the following claims.

I claim:

1. A projection-exposure apparatus comprising:
   (a) an X-ray source;
   (b) an illumination-optical system operable to irradiate a surface of a reticle defining a pattern with X-rays emitted from the X-ray source;
   (c) a projection-optical system operable to receive X-rays reflected by the surface of the reticle and to project and focus an image of the irradiated pattern onto a surface of a substrate;
   (d) a reticle stage operable to secure the reticle;
   (e) a substrate stage operable to secure the substrate;
   (f) a vacuum chamber enclosing the projection-optical system, the reticle stage, and the substrate stage;
   (g) an axial-position detection system operable to optically detect the position of the substrate in the direction of an optical axis of the projection-optical system, wherein the axial-position detection system comprises (i) a light source, (ii) a first slit, (iii) a light-transmitting system operable to illuminate the first slit, (iv) a first optical assembly operable to project an image of the first slit onto the surface of the substrate, (v) a second slit, (vi) a second optical assembly operable to project the projected image of the first slit formed on the surface of the substrate onto the second slit, and (vii) a detector operable to receive light that passes through the second slit; and
   (h) wherein at least the first slit, first optical assembly, second slit, and second optical assembly are disposed within the vacuum chamber.

2. The projection-exposure apparatus of claim 1, wherein the axial-position detection system flanks the projection-optical system.

3. The projection-exposure apparatus of claim 1, wherein at least a part of the light-transmitting system is disposed within the vacuum chamber.

4. The projection-exposure apparatus of claim 3, wherein the axial-position detection system flanks the projection-optical system.

5. The projection-exposure apparatus of claim 1, wherein the light source is a white light source.

6. The projection-exposure apparatus of claim 1, wherein the second optical assembly further comprises a mirror and a drive mechanism that periodically varies an angle of the mirror.

7. The projection-exposure apparatus of claim 6, wherein the drive mechanism comprises a piezo-electric element.

8. The projection-exposure apparatus claim 1, wherein the first slit and the second slit include one or more openings formed therein such that respective positions of one or more points on the surface of the substrate are measurable simultaneously.

9. The projection-exposure apparatus of claim 1, wherein the axial-position detection system further includes a temperature-regulating mechanism.

10. The projection-exposure apparatus of claim 9, wherein the light-transmitting system includes a temperature-regulating mechanism.

11. The projection-exposure apparatus of claim 1, wherein the first optical assembly and the second optical assembly comprise at least one mirror formed of a low-thermal-expansion glass.

12. The projection-exposure apparatus of claim 11, wherein the low-thermal-expansion glass possesses a thermal-expansion coefficient of about $10^{-6}$ $K^{-1}$ or less.

13. The projection-exposure apparatus of claim 1, wherein at least a portion of the light-transmitting system is formed of a low-thermal-expansion metal.

14. The projection-exposure apparatus of claim 1, wherein at least a portion of the first optical assembly or the second optical assembly is formed of a low-thermal-expansion metal.

15. A projection-exposure apparatus comprising:

(a) an X-ray source;

(b) an illumination-optical system operable to irradiate a surface of a reticle defining a pattern with X-rays emitted from the X-ray source;

(c) a projection-optical system operable to receive X-rays reflected by the surface of the reticle and to project and focus an image of the irradiated pattern onto a surface of a substrate;

(d) a vacuum chamber enclosing the projection-optical system, the reticle, and the substrate;

(e) an axial-position detection system operable to optically detect the position of the substrate in the direction of an optical axis of the projection-optical system, wherein the axial-position detection system comprises (i) a light source, (ii) a first slit, (iii) a light-transmitting system operable to illuminate the first slit, (iv) a first optical assembly operable to project an image of the first slit onto the surface of the substrate, (v) a second slit, (vi) a second optical assembly operable to project the projected image of the first slit formed on the surface of the substrate onto the second slit, and (vii) a detector operable to receive light that passes through the second slit; and (f) wherein the first slit, first optical assembly, second slit, second optical assembly, and detector are disposed within the vacuum chamber.

16. The projection-exposure apparatus of claim 15, wherein the light-transmitting system includes an optical fiber.

17. The projection-exposure apparatus of claim 15, wherein the first slit forms a plurality of openings.

18. An axial-position detection system operable to optically detect a position of a substrate in the direction of an optical axis of a projection-optical system, wherein the axial-position detection system comprises:

(a) a light source;

(b) a first slit;

(c) a light-transmitting system operable to illuminate the first slit;

(d) a first optical assembly operable to project an image of the first slit onto the surface of the substrate;

(e) a second slit;

(f) a second optical assembly operable to project the projected image of the first slit formed on the surface of the substrate onto the second slit;

(g) a detector operable to receive light that passes through the second slit; and (h) wherein at least the first slit, first optical assembly, second slit, and second optical assembly are disposed within a vacuum chamber.

19. The axial-position detection system of claim 18, wherein the light source comprises a white light source.

20. The axial-position detection system of claim 18, wherein the second optical assembly further comprises a mirror and a drive mechanism that periodically varies an angle of the mirror.

* * * * *